(12) United States Patent
Zhong et al.

(10) Patent No.: US 11,255,793 B2
(45) Date of Patent: Feb. 22, 2022

(54) BIOSENSORS FOR BIOLOGICAL OR CHEMICAL ANALYSIS AND METHODS OF MANUFACTURING THE SAME COMPRISING A PLURALITY OF WELLS FORMED BY A METAL OR METAL OXIDE LAYER

(71) Applicant: MGI TECH CO., LTD., Guangdong (CN)

(72) Inventors: Cheng Frank Zhong, San Jose, CA (US); Shifeng Li, San Jose, CA (US)

(73) Assignee: MGI Tech Co., Ltd., Shenzhen (CN)

( * ) Notice: Subject to any disclaimer, the term of this patent is extended or adjusted under 35 U.S.C. 154(b) by 293 days.

(21) Appl. No.: 16/495,781

(22) PCT Filed: Mar. 19, 2018

(86) PCT No.: PCT/US2018/023176
§ 371 (c)(1),
(2) Date: Sep. 19, 2019

(87) PCT Pub. No.: WO2018/175341
PCT Pub. Date: Sep. 27, 2018

(65) Prior Publication Data
US 2020/0096450 A1 Mar. 26, 2020

Related U.S. Application Data

(60) Provisional application No. 62/473,970, filed on Mar. 20, 2017.

(51) Int. Cl.
*H01L 27/146* (2006.01)
*G01N 21/76* (2006.01)
(Continued)

(52) U.S. Cl.
CPC ....... *G01N 21/763* (2013.01); *G01N 21/6454* (2013.01); *H01L 21/823871* (2013.01); *H01L 27/1464* (2013.01)

(58) Field of Classification Search
CPC .......... H01L 27/1464; H01L 27/14636; H01L 21/823871; H01L 27/14634;
(Continued)

(56) References Cited

U.S. PATENT DOCUMENTS 6,210,891 B1 4/2001 Nyren et al.
6,325,977 B1 12/2001 Theil
(Continued)

FOREIGN PATENT DOCUMENTS

CN 102713720 10/2012
CN 104372080 2/2015
(Continued)

OTHER PUBLICATIONS

Supplementary European Search Report for Application No. 18 77 0661, dated Dec. 16, 2020, 12 pages.
(Continued)

*Primary Examiner* — Que Tan Le
(74) *Attorney, Agent, or Firm* — Kilpatrick Townsend & Stockton LLP

(57) ABSTRACT

Embodiments of the invention provide an improved biosensor for biological or chemical analysis. According to embodiments of the invention, backside illumination (BSI) complementary metal-oxide-semiconductor (CMOS) image sensors can be used to effectively analyze and measure fluorescence or chemiluminescence of a sample. This measured value can be used to help identify a sample. Embodiments of the invention also provide methods of manufacturing an improved biosensor for biological or chemical analysis and systems and methods of DNA sequencing.

20 Claims, 9 Drawing Sheets

(51) Int. Cl.
*G01N 21/64* (2006.01)
*H01L 21/8238* (2006.01)

(58) Field of Classification Search
CPC ......... H01L 27/14643; H01L 27/1469; G01N 21/6454; G01N 21/76; G01N 21/763; C12Q 1/6874
USPC .............................................. 250/208.1, 239
See application file for complete search history.

(56) References Cited

U.S. PATENT DOCUMENTS

| | | | |
|---|---|---|---|
| 6,828,100 | B1 | 12/2004 | Ronaghi |
| 6,833,246 | B2 | 12/2004 | Balasubramanian |
| 6,911,345 | B2 | 6/2005 | Quake et al. |
| 7,883,869 | B2 | 2/2011 | Ju et al. |
| 7,910,354 | B2 | 3/2011 | Drmanac et al. |
| 7,972,820 | B2 | 7/2011 | Mayer |
| 8,105,771 | B2 | 1/2012 | Drmanac |
| 8,133,719 | B2 | 3/2012 | Drmanac et al. |
| 8,216,827 | B2 | 7/2012 | Pouteau et al. |
| 8,445,194 | B2 | 5/2013 | Drmanac et al. |
| 8,592,150 | B2 | 11/2013 | Drmanac et al. |
| 8,637,242 | B2 | 1/2014 | Shen et al. |
| 8,778,849 | B2 | 7/2014 | Bowen et al. |
| 8,906,320 | B1 | 12/2014 | Eltoukhy et al. |
| 9,222,132 | B2 | 12/2015 | Drmanac |
| 9,671,344 | B2 | 6/2017 | Staker |
| 10,784,103 | B2 * | 9/2020 | Li .................... G01N 33/48707 |
| 2006/0084069 | A1 | 4/2006 | Chan et al. |
| 2006/0273430 | A1 | 12/2006 | Hua et al. |
| 2008/0029864 | A1 | 2/2008 | Pyo et al. |
| 2008/0081769 | A1 | 4/2008 | Hassibi |
| 2009/0111207 | A1 | 4/2009 | Choumane et al. |
| 2010/0204064 | A1 | 8/2010 | Cho |
| 2010/0277722 | A1 | 11/2010 | Kraiczek et al. |
| 2011/0045466 | A1 | 2/2011 | Lin et al. |
| 2011/0096157 | A1 | 4/2011 | Fine et al. |
| 2011/0172129 | A1 | 7/2011 | Lee et al. |
| 2012/0156100 | A1 | 6/2012 | Tsai et al. |
| 2012/0224050 | A1 | 9/2012 | Staker |
| 2012/0231830 | A1 | 9/2012 | Jeong et al. |
| 2012/0261830 | A1 | 10/2012 | Chu et al. |
| 2013/0116153 | A1 | 5/2013 | Bowen et al. |
| 2013/0293749 | A1 | 11/2013 | Vaartstra |
| 2014/0152801 | A1 | 6/2014 | Fine |
| 2014/0272719 | A1 | 9/2014 | Liu et al. |
| 2014/0376069 | A1 | 12/2014 | Reinmuth |
| 2015/0056097 | A1 | 2/2015 | Vaartstra |
| 2015/0079596 | A1 | 3/2015 | Eltoukhy et al. |
| 2015/0087534 | A1 | 3/2015 | Gormley et al. |
| 2015/0177150 | A1 | 6/2015 | Rothberg et al. |
| 2015/0279894 | A1 | 10/2015 | Cheng et al. |
| 2016/0064439 | A1 | 3/2016 | Or-Bach et al. |
| 2016/0133517 | A1 | 5/2016 | Delamarche et al. |
| 2016/0237488 | A1 | 8/2016 | Ke et al. |
| 2016/0338347 | A1 | 11/2016 | White et al. |
| 2018/0155782 | A1 | 6/2018 | Zhong |
| 2018/0195961 | A1 | 7/2018 | Earney et al. |

FOREIGN PATENT DOCUMENTS

| | | |
|---|---|---|
| CN | 105980580 | 9/2016 |
| CN | 105980832 | 9/2016 |
| EP | 2221606 A2 | 8/2010 |
| EP | 2362418 A2 | 8/2011 |
| JP | 2004532397 A | 10/2004 |
| JP | 2007333497 A | 12/2007 |
| JP | 2013509618 A | 3/2013 |
| JP | 2013084747 A | 5/2013 |
| JP | 2013092393 A | 5/2013 |
| JP | 2015073070 A | 4/2015 |
| JP | 2015533503 A | 11/2015 |
| WO | 2009/001988 A1 | 12/2008 |
| WO | 2011103497 A1 | 8/2011 |
| WO | 2014031157 A1 | 2/2014 |
| WO | 2014077783 A1 | 5/2014 |
| WO | 2015089092 A1 | 6/2015 |
| WO | 2016032562 A1 | 3/2016 |
| WO | 2018/175341 A | 3/2018 |
| WO | 2018085642 A1 | 5/2018 |

OTHER PUBLICATIONS

Arkles, B., "Hydrophobicity, Hydrophilicity and Silanes", *Paint & Coatings Industry*, Jan. 1, 2006, 10 pages, retrieved from the Internet on Jan. 8, 2013 at URL:http://www.gelest.com/goods/pdf/Library/advances/HydrophobicityHydrophilictyandSilanes.pdf.

Drmanac et al., "Human Genome Sequencing Using Unchained Base Reads on Self-Assembling DNA Nanoarrays", Science, Reports, vol. 327, No. 5961, Jan. 1, 2010, pp. 78-81.

Frank et al., "Image Artifacts in Backside Illumination CMOS Image Sensors Associated with Electrostatic Charge", Papers of the International Image Sensor Society, R18, 2019, pp. 1-3.

PCT/US2017/059908, "International Search Report and Written Opinion", dated Feb. 2, 2018, 18 pages.

PCT/US2018/050437, "International Search Report and Written Opinion", dated Dec. 13, 2018, 14 pages.

Ronaghi et al., "DNA Sequencing: A Sequencing Method Based on Real-Time Pyrophosphate", Science, vol. 281, Issue 2375, Jul. 17, 1998, pp. 363-365.

Seitz et al., "Chemiluminescence and Bioluminescence", Analytical Chemistry, vol. 46, No. 2, Feb. 1974, pp. 188-202.

Shendure et al., "Next-Generation DNA Sequencing", Nature Biotechnology, vol. 26, No. 10, Oct. 1, 2008, pp. 1135-1145.

Toyohasi University of Technology, "Biosensor Based On A Microelectromechanical System Integrated With a Photodector", PhysOrg, Mar. 3, 2014, pp. 1-2, obtained from https://phys.org/news/2014-03-biosensor-based-nnicroelectronnechanical-photodetector.htnnl.

Calabria, Dissertation Thesis, "Implementation of Chemiluminescence and Color-Based Detection in Smartphone For Bioassays", University of Bologna, Apr. 27, 2016, pp. 1-128.

Calabria, Dissertation Thesis Date, "Implementation of Chemiluminescence and Color-Based Detection in Smartphone For Bioassays", University of Bologna, Apr. 27, 2016, pp. 1-2.

Notification of Transmittal of the International Search Report and the Written Opinion of the International Search Authority, or the Declaration received for International Patent Application No. PCT/US2018/023176 filed Mar. 19, 2018, dated Jun. 13, 2018, 13 pages.

Application 17867617.7, Extended European Search Report, dated May 25, 2020, 11 Pages.

PCT/US2018/023176—International Preliminary Report on Patentability, dated Oct. 3, 2019, 9 Pages.

U.S. Appl. No. 15/803,077, Final Office Action, dated Jan. 5, 2022, 31 pages.

Deetlefs et al., "Quill Ionic Liquids", Catalyst, Available Online at: https://www.stem.org.uk/system/files/elibrary-resources/legacy_files_migrated/36428-Catalyst_25_2_602.pdf, Dec. 2014, pp. 16-18.

Kedmi et al., "The Systemic Toxicity of Positively Charged Lipid Nanoparticles and the Role of Toll-Like Receptor 4 in Immune Activation", Biomaterials, vol. 31, Issue 26, Sep. 2010, pp. 6867-6875.

Sobek et al., "Analysis of Fluorescent Dyes Used for Labeling DNA in Microarray Experiments", 2021, pp. 1-6.

* cited by examiner

BIOSENSORS FOR BIOLOGICAL OR CHEMICAL ANALYSIS AND METHODS OF MANUFACTURING THE SAME COMPRISING A PLURALITY OF WELLS FORMED BY A METAL OR METAL OXIDE LAYER

CROSS-REFERENCES TO RELATED APPLICATIONS

This application claims priority to U.S. Provisional Patent Application No. 62/473,970, filed Mar. 20, 2017, the content of which is incorporated by reference in its entirety.

FIELD

The present invention relates generally to a biosensor for biological or chemical analysis, and more specifically, to a biosensor including a backside illumination (BSI) complementary metal-oxide-semiconductor (CMOS) image sensor and methods of manufacturing the same.

BACKGROUND

CMOS image sensors find use in electronic imaging devices, including digital cameras, medical imaging equipment, radar devices, and the like. Using integrated circuits and a series of photodiodes, CMOS image sensors can capture light and convert it into electrical signals.

CMOS image sensors are typically implemented on chips. The chips may have an amplifier for each pixel. Although the inclusion of many amplifiers in a chip may result in less area for the capture of light, other components can be integrated onto the chip to direct more light into the photodiodes. For example, microlenses may be placed in front of the photodiodes to direct light into the photodiodes. To further increase the amount of light that hits the photodiodes, backside illumination (BSI) can be used. BSI effectively places the photodiodes closer to the light source, instead of under and between the integrated circuit wiring, reducing destructive interference. BSI CMOS sensors also have other advantages. For example, BSI CMOS sensors may have low operating voltage, low power consumption, high efficiency, and low noise.

BSI CMOS image sensors typically have two functional areas: a light sensing area and an electronic circuit area. The light sensing area includes the photodiodes arranged in an array, coupled to metal-oxide-semiconductor (MOS) transistors that detect the light intensity. The electronic circuit area provides connections between the MOS transistors and external connections, such as to other devices for processing the data from the MOS transistors.

In practice, a BSI CMOS image sensor employs filters that divide incident light into bands of light of different wavelengths. The light is received by the photodiodes on a substrate and transformed into electrical signals of different intensity. For example, an incident beam may be divided into red, green, and blue light and received by respective photodiodes for each color. Each photodiode transforms the detected light intensity into electrical signals. This is accomplished by the photodiode accumulating a charge. For example, the higher the intensity of the light, the higher the charge accumulated in the photodiode. The accumulated charge can then be correlated to a color and brightness.

In addition to the uses described above, CMOS image sensors may also be used for biological or chemical analysis. For such analysis, a biological or chemical sample may be placed above a photodiode, and light emitted by the biological or chemical sample may be directed to the photodiode. The fluorescence or chemiluminescence of the sample can be detected by the photodiode, and a color and brightness can be determined. This color and brightness may be used to identify the biological or chemical sample.

SUMMARY

Embodiments of the invention address the drawbacks associated with previous approaches by providing an improved biosensor for biological or chemical analysis. According to embodiments of the invention, BSI CMOS image sensors can be used to effectively analyze and measure fluorescence or chemiluminescence of a sample. This measured value can be used to help identify a sample. Embodiments of the invention also provide methods of manufacturing an improved biosensor for biological or chemical analysis. As used herein, the term "biosensor" may be used to refer to an apparatus for determining a light emitting substance within or attached to a biological molecule, particularly a nucleic acid macromolecule exemplified by DNA and branched or otherwise derivatized nucleic acids. As used herein, the term "nucleic acid macromolecule" may refer to, for example, DNB or single strand embodiments.

According to some embodiments, a biosensor is provided. The biosensor comprises a backside illumination complementary metal-oxide-semiconductor (CMOS) image sensor. The backside illumination CMOS image sensor includes an electronic circuit layer and a photo sensing layer over the electronic circuit layer. The photo sensing layer includes a substrate layer and a plurality of photodiodes having a first top surface and a first bottom surface. The first bottom surface is in contact with the electronic circuit layer and the first top surface includes a light receiving surface. The biosensor further comprises a metal layer over the photo sensing layer. The metal layer has a second top surface and a second bottom surface. The metal layer defines a plurality of voids. Each void of the plurality of voids is aligned with at least one photodiode of the plurality of photodiodes. The second top surface is coated or treated with a first material to form a first covering layer. The biosensor optionally comprises a passivation layer over the plurality of photodiodes. The passivation layer has a third top surface and a third bottom surface. The metal layer and the first top surface of the plurality of photodiodes or the third top surface of the passivation layer form a plurality of wells. Wall(s) of each well are formed from the metal layer. A bottom of each well is formed from the first top surface of the plurality of photodiodes or, if a passivation layer is present, is formed from the third top surface of the passivation layer. The bottom of each well is coated or treated with a second material to form a second covering layer. The first material is different than the second material.

According to some embodiments, a method is provided. The method comprises providing a backside illumination complementary metal-oxide-semiconductor (CMOS) image sensor. Providing the backside illumination CMOS image sensor includes providing an electronic circuit layer and providing a photo sensing layer over the electronic circuit layer. The photo sensing layer includes a substrate layer and a plurality of photodiodes having a first top surface and a first bottom surface. The first bottom surface is in contact with the electronic circuit layer. The first top surface includes a light receiving surface. The method further comprises forming a metal layer over the photo sensing layer.

The metal layer has a second top surface and a second bottom surface. The metal layer defines a plurality of voids. Each void of the plurality of voids is aligned with at least one photodiode of the plurality of photodiodes. The second top surface is coated or treated with a first material to form a first covering layer. The method optionally comprises forming a passivation layer over the plurality of photodiodes, the passivation layer having a third top surface and a third bottom surface. The metal layer and the first top surface of the plurality of photodiodes or the third top surface of the passivation layer form a plurality of wells. Wall(s) of each well are formed from the metal layer. A bottom of each well s formed from the first top surface of the plurality of photodiodes or, if a passivation layer is present, is formed from the third top surface of the passivation layer. The bottom of each well is coated or treated with a second material to form a second covering layer. The first material is different than the second material.

The foregoing, together with other features and embodiments, will become more apparent upon referring to the following specification, claims, and accompanying drawings.

BRIEF DESCRIPTION OF THE DRAWINGS

Illustrative embodiments of the present invention are described in detail below with reference to the following drawing figures.

DETAILED DESCRIPTION

Figure 1:
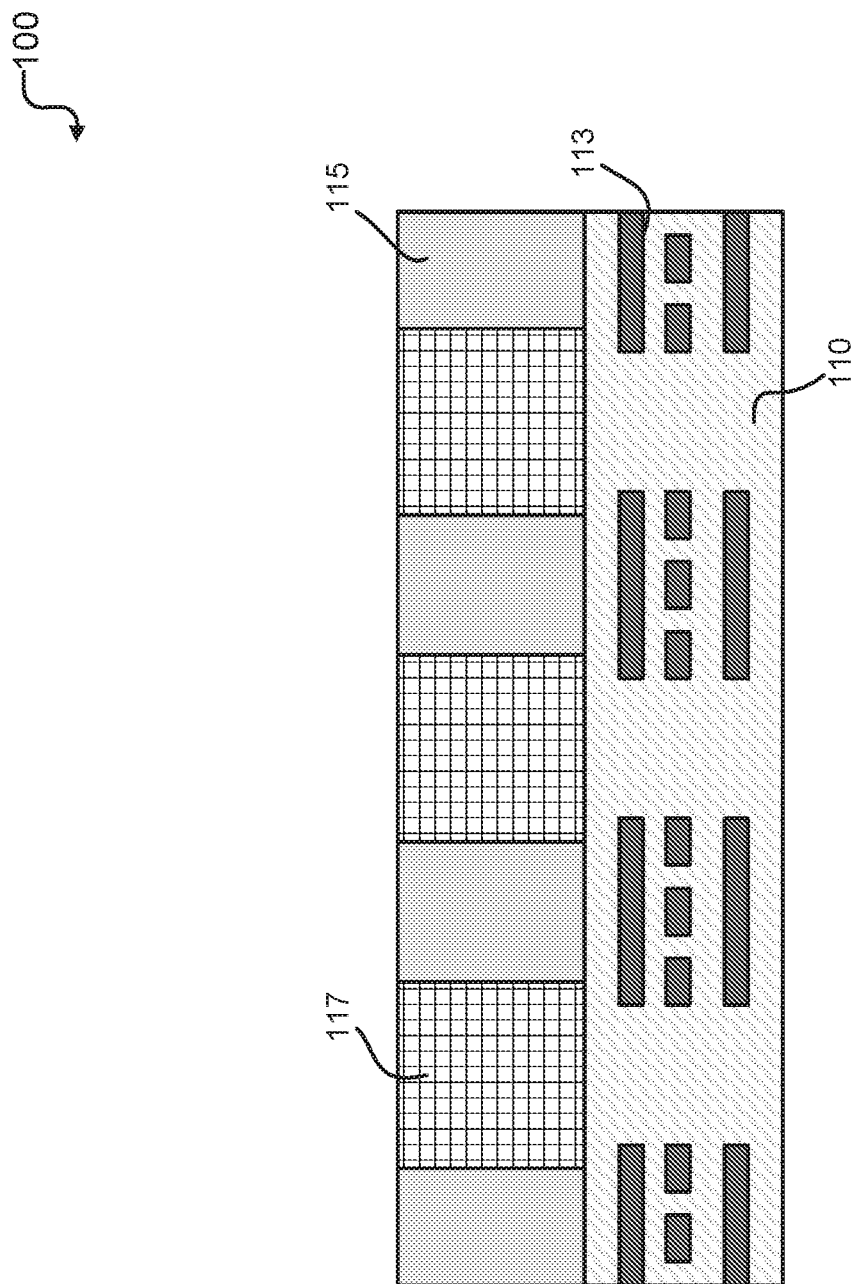
FIG. 1 is a cross-sectional view of a backside illumination CMOS image sensor, according to some embodiments

FIGS. 1-9 describe various stages of manufacture of a biosensor according to embodiments of the invention. Other embodiments of manufacture and configuration will be evident from this description to those of skill in the art. It is therefore intended that the following description be descriptive but not limiting.

For ease of reading, the text below is organized into sections. However, it will be understood that a description of subject matter in one section (e.g., descriptions of macromolecules, filters, sequencing methods, etc.) may also apply to subject matter in other sections.

Biosensors according to embodiments of the invention are not limited to a particular use. In one aspect, the biosensors of embodiments of the invention find particular use for massively parallel DNA sequencing. DNA sequencing technologies are well known (see, e.g., Drmanac et al., 2010, "Human genome sequencing using unchained base reads on self-assembling DNA nanoarrays," *Science* 327:78-81; Shendure & Ji, (2008, "Next-generation DNA sequencing," *Nature Biotechnology* 26:1135-45) and are therefore described only in general terms in sections below. The following paragraphs provide a brief initial discussion of sequencing and associated terminology so that certain features of the biosensors described below may be more easily understood.

A variety of DNA sequencing methods are known. In many approaches, large molecules (e.g., genomic DNA)) are broken into many smaller fragments, each having a characteristic DNA sequence. In array based technologies, the fragments are distributed to an array of positions on a substrate so that each position in the array contains a DNA fragment with a single characteristic sequence. Sequence information ("reads") is obtained from DNAs at each of thousands, or more often, millions, of positions simultaneously and assembled by a computer. In most sequencing approaches, the fragments are amplified prior to sequence determination. The amplification may occur prior to the positioning of the fragments at each position, after the positioning of the fragments at each position, or both before and after positioning. The amplification step(s) produce "amplicons" which serve as "templates" in a sequencing process. This, for illustration, amplification may use RCA to produce a single-stranded concatemer (e.g., a DNA nanoball) at each position on the array or use bridge PCR to produce a clonal population (or cluster) of DNA molecules with the same sequence at each position.

It will be understood that reference to a "DNA macromolecule," and the like, encompasses DNA nanoballs, branched structures, and clustered clonal populations (i.e., more than a single molecule) or their precursors. In addition, a "DNA macromolecule," and the like, may encompass auxiliary DNA molecules such as primers, growing strands produced by primer extension or other processes encompasses, signal generating compounds derived from the macromolecule (e.g., a dye released from the macromolecule by cleavage of a linker) or from a binding agent such as an antibody. In many sequencing technologies, it is the auxiliary DNA molecules that comprise (or are "labeled" with) a detectable (e.g., fluorescent or chemiluminescent) dye that emits light detected by photodiodes of the biosensor. In some approaches, a chemiluminescent signal is generated by a luciferase-based system (e.g., pyrosequencing; see U.S. Pat. No. 8,916,347; Ahmadian et al., 2006, *Clinica Chimica Acta* 363 (1):83-94). Thus, a phrase such as "detecting light emitted from the macromolecule" will be understood to encompass "detecting light emitted from the macromolecule or from auxiliary molecules (e.g., labeled auxiliary molecules").

It will be appreciated that the biosensor of the invention may be used to detect signal from any light-emitting source. In various embodiments, the emitted light may be a result of fluorescence, chemiluminescence (including bioluminescence), or phosphorescence. In some cases, the light source emits incandescent light. The devices described herein are especially well suited for detecting chemiluminescent signals, which are generated without the need for an excitation light source.

In array-based sequencing methods, and the biosensors of embodiments of the invention, DNA macromolecules are positioned on a substrate in wells or on "spots." The wells or spots are able to receive and retain the macromolecule. Often, the spots, sometimes called "discrete spaced apart regions" or "pads", comprise a substrate functionalized to receive a nucleic acid macromolecule and the spots are separated by areas that are "inert" in the sense that DNA macromolecules do not bind such areas. For example, and without limitation, see Drmanac 2010, supra. "Wells" are a type of spot comprising walls that form a boundary or barrier to the DNA macromolecules. Except where clear from context, reference to "spots" below may include wells.

In biosensors of embodiments of the invention, spots generally have uniform dimensions and are organized as a regular array (i.e., spots are not at random positions). The spots of an array are generally organized in a rectilinear pattern, often in columns and rows, bat other regular patterns may be used (e.g., a spiral). The spots of an array may have characteristic dimensions, pitch, and density. The spots themselves may be circular, square, hexagonal or other shape. In the discussion below, the spots are generally assumed to be circular (i.e., can be described as having a diameter). It will be understood that reference to a "diameter" can also refer to linear dimensions of other shaped spots (e.g., diagonal, length or width). Thus, as used herein, "linear dimension" can refer to a diameter of a circle, width of a square, diagonal, and the like. In the context of biosensors of embodiments of the invention, the size of the spots is meaningful in two ways. First, the spots may be sized and/or functionalized in a way that limits occupancy to a single target sequence. This may be a single DNA nanoball (a concatemer of a single target sequence) or a clonal cluster with a single target sequence. See, e.g., U.S. Pat. No. 8,133,719 and U.S. Pat. App. Pub. No. 2013/0116153, both incorporated by reference in their entireties for all purposes. Secondly, generally the spots may be sized and positioned relative to underlying photodiodes so that each photodiode receives emitted light from a single spot. In some embodiments, an array of spots may be positioned over an array of corresponding photodiode(s) (and/or filters, e.g., color filters) with a 1 to 1 correlation. That is, light emitted from an, e.g., DNA macromolecule at individual spot passes into an underlying filter and light not blocked by the filter is detected by a single photodiode associated with the filter, or light emitted from an, e.g., DNA macromolecule, at individual spot passes into a plurality of underlying filters. Thus, as also discussed below, in some embodiments, light emitted from a single spot may be detected by more than one photodiode (e.g., 2, 3, 4, etc.) photodiodes. In these embodiments, a group of multiple photodiodes associated with a single spot may be referred to as a "unit cell" of photodiodes. The spots and filters (e.g., single filters or unit cells) may be arranged in the biosensor such that each photodiode in the unit cell receives light emitted from the same single spot. In addition, in some embodiments, the area of the light receiving surface of a photodiode, or combined area of the light receiving surfaces of multiple photodiodes associated with the same spot, is less than the area of the spot (from which light is emitted). Put another way, the spot may be smaller than the underlying photodiode(s) such that the boundary of the spot, if projected onto the light receiving surface of the photodiode(s), is contained within the light receiving surface.

As is well known, nucleic acid sequencing generally involves an iterative process in which a fluorescent or chemiluminescent label is associated in a sequence in a specific way with the DNA template (amplicon) being sequenced, the association is detected, and the label is removed in the sense that it no longer emits a signal. See, e.g., U.S. Pat. App. Pub. No. 2016/0237488; U.S. Pat. App. Pub. No. 2012/0224050; U.S. Pat. Nos. 8,133,719; 7,910,354; 9,222,132; 6,210,891; 6,828,100, 6,833,246; and 6,911,345, herein incorporated by reference in their entireties. Thus it will be appreciated that, for example, "labeling a nucleic acid macromolecule with a fluorescent label" may refer to associating a labeled auxiliary molecule(s) with a DNA template immobilized on a spot.

Turning now to the drawings, FIG. 1 is a cross-sectional view of a backside illumination (BSI) CMOS image sensor 100 according to some embodiments. The BSI CMOS image sensor 100 may include a dielectric layer 110. Although described as being dielectric, it is contemplated that the dielectric layer 110 may include any suitable electrically insulating material. The dielectric layer 100 may include metal wiring 113. The metal wiring 113 may include integrated circuit materials and external connections. Together, the dielectric layer 100 and the metal wiring 113 may be collectively referred to herein as an "electronic circuit layer" of the BSI CMOS image sensor.

A substrate layer 115 may be provided over the dielectric layer 110 and the metal wiring 113. The substrate layer 115 may be made of any suitable material, such as, for example, silicon, III-V group on silicon, graphene-on-silicon, silicon-on-insulator, combinations thereof, and the like. The substrate layer 115 may include openings in which light sensing components (e.g., photodiodes 117) may be positioned. Although described herein with respect to photodiodes 117, it is contemplated that any suitable light sensing component may be used. The photodiodes 117 may be configured to convert measured light into current. Photodiodes 117 may include the source and drain of a MOS transistor (not shown) that may transfer the current to other components, such as other MOS transistors. The other components may include a reset transistor, a current source follower or a row selector for transforming the current into digital signals, and the like. Together, the substrate layer 115 and the photodiodes 117 may be collectively referred to herein as a "photo sensing layer" of the BSI CMOS image sensor.

The photodiodes 117 may be in contact with metal wiring 113 to communicate the digital signals to external connections via the metal wiring 113. In the BSI CMOS image sensor 100 illustrated in FIG. 1, the light receiving surface is positioned at the top of the photodiodes 117 (i.e., on a surface not in contact with the electronic circuit layer and opposite to the electronic circuit layer), and incident light is received by the photodiodes 117 at this light receiving surface.

Figure 2:
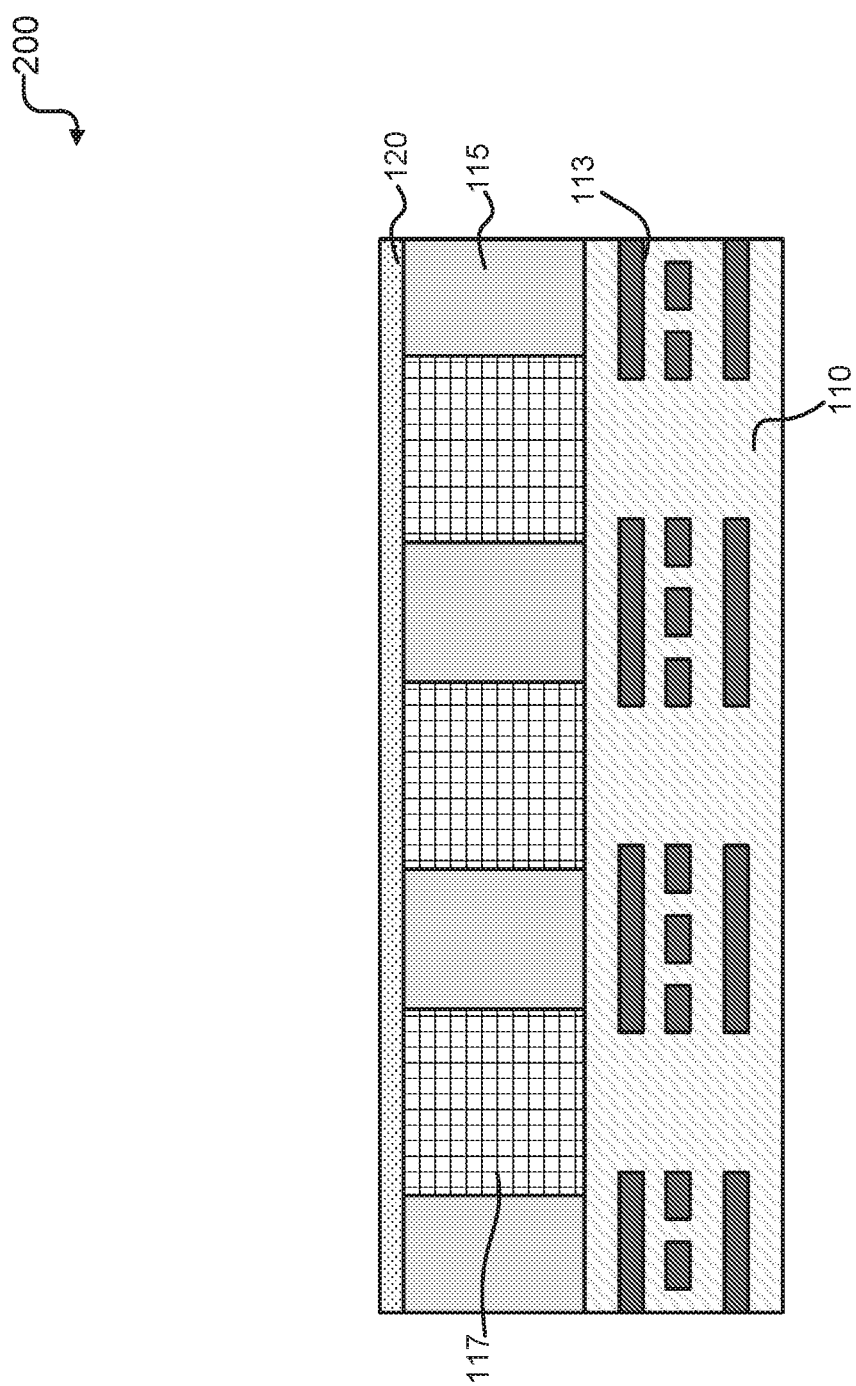
FIG. 2 is a cross-sectional view of a backside illumination CMOS image sensor with a passivation layer, according to some embodiments.
Figure 3:
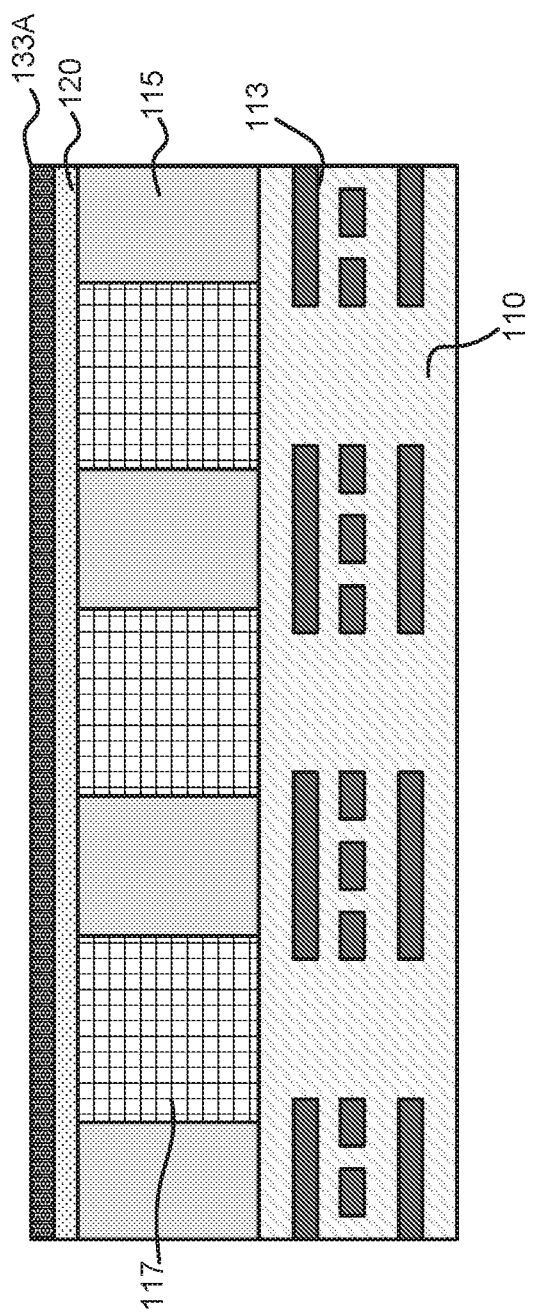
FIG. 3 is a cross-sectional view of a backside illumination CMOS image sensor with a metal layer, according to some embodiments.

FIG. 2 illustrates a biosensor 200 that may be used for biological or chemical analysis (e.g., to detect the chemiluminescence of a macromolecule or macromolecular complex), according to some embodiments. The biosensor 200 includes a backside illumination CMOS image sensor 100. The backside illumination CMOS image sensor 100 includes an electronic circuit layer (comprised of the dielectric layer 110 and the metal wiring 113) and a photo sensing layer over the electronic circuit layer (comprised of a substrate layer 115 and photodiodes 117). The photodiodes 117 may be in contact with the electronic circuit layer such that electronic signals may be transmitted from the photodiode 117 to the electronic circuit layer, and in some embodiments, to an external device. A light receiving surface is defined by a surface of the photodiodes 117 that is opposite to the electronic circuit layer (i.e., the surface in contact with the passivation layer 120). That is, the light receiving surface of a photodiode is the surface closest to the position at which the light source is located.

According to FIG. 2, a passivation layer 120 may be deposited by conventional semiconductor processing techniques (e.g., low temperature plasma chemical vapor deposition, PECVD, sputtering, ALD, spin coating, dipping, etc.) on the substrate layer 115 and the photodiodes 117 of the BSI CMOS image sensor 100. The passivation layer 120 may include any suitable protective material. For example, the passivation layer 120 may include materials such as silicon, silicon nitride, silicon oxide, metals oxides, combinations thereof, and the like. The passivation layer 120 may act as an etch stop for later etching steps, as described further herein. The passivation layer 120 may alternatively or additionally act to protect the active device (i.e., the backside illumination CMOS sensor). The passivation layer 120 may alternatively or additionally act to protect photodiodes 117 from wear caused by frequent use. The passivation layer 120 may be transparent. In one example, the passivation layer 120 may have a thickness of 100 nanometers or less.

Spots or wells (not shown) may be formed over or in the first passivation layer 120 on or over which chemical or biological samples may be placed for analysis. In some embodiments, the biosensor 200 may be adapted for detecting an optical signal (e.g., fluorescent or chemiluminescent emission) from a corresponding array of biomolecules, where individual biomolecules may be positioned over (e.g., in spots or wells) one or more photodiodes such that the one or more photodiodes receive light from the biomolecule.

Various further embodiments for constructing biosensors using a backside illumination CMOS sensor 100 may now be described. According to FIG. 3, a metal layer or metal oxide layer 133A may be deposited by conventional semiconductor processing techniques on the passivation layer 120 of biosensor 200 (e.g., by sputtering, e-beam evaporation, thermal evaporation, ALD, etc.). The metal layer or metal oxide layer 133A may include any suitable metal material. For example, the metal layer or metal oxide layer 133A may include materials such as tungsten, titanium, titanium nitride, silver, tantalum, hafnium, chromium, platinum, tungsten, aluminum, gold, copper, combinations or alloys thereof, and metal oxides such as $Al_2O_3$, $CrO_2$, $TiO_2$, $ZrO_2$, $Ta_2O_5$, HfO, $WO_2$, and combinations thereof, etc. The metal layer or metal oxide layer 133A may be opaque to incident light and/or, when present, to excitation light.

Figure 4:
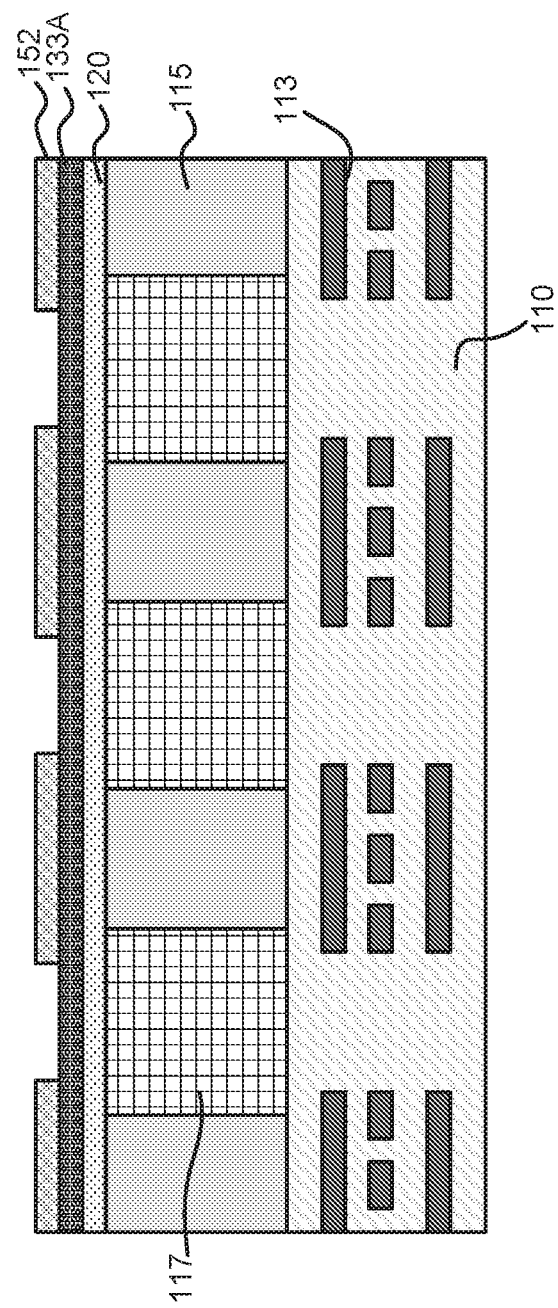
FIG. 4 is a cross-sectional view of a backside illumination CMOS image sensor with a mask over the metal layer, according to some embodiments.

According to FIG. 4, a mask 152 may be applied to the metal layer or metal oxide layer 133A with openings aligned over the photodiodes 117. The mask 152 may be applied according to any suitable method, such as spin coating, dipping, and/or the like. The mask 152 may also be of any suitable material, such as a photoresist. In some embodiments, the mask 152 is a hard mask. Although shown as already being patterned to have openings aligned over the photodiodes, it is contemplated that the mask 152 may be applied to the entire metal layer or metal oxide layer 133A and patterned with the openings according to conventional semiconductor techniques.

Figure 5:
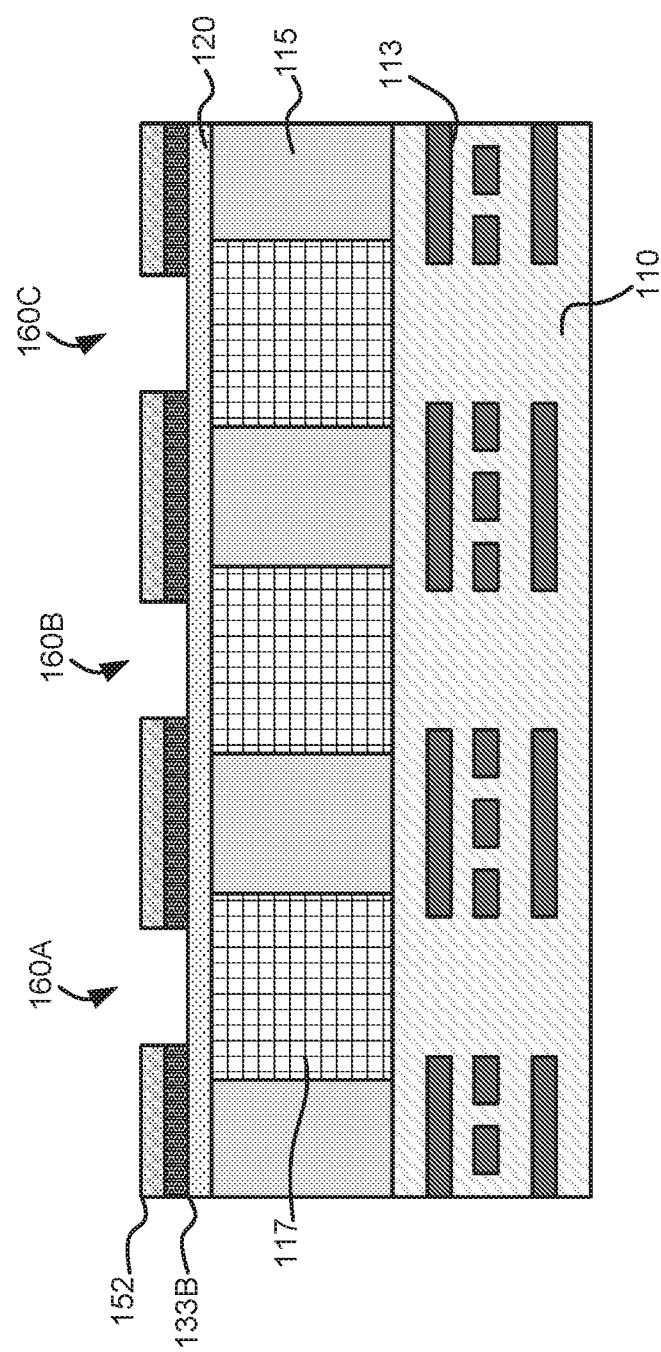
FIG. 5 is a cross-sectional view of a backside illumination CMOS image sensor with an etched metal layer, according to some embodiments.

According to FIG. 5, the metal layer or metal oxide layer 133B may be etched out of the metal layer or metal oxide layer 133A, respectively, or patterned, creating voids 160A-C in the metal layer or metal oxide layer 133A. In some embodiments, the voids 160A-C may be aligned center to center with the photodiodes 117. In some embodiments, the voids 160A-C may have a diameter in the range of 100 nanometer to 1 micrometer. The voids 160A-C may have a smaller width or diameter than the photodiodes 117. In some embodiments, biological or chemical samples may be placed in the voids, and light emitted from the samples may be used to measure their fluorescence or chemiluminescence, as described further herein. In embodiments in which the voids 160A-C are smaller in width or diameter than the photodiodes 117, there may be increased blockage of incident or excitation light, resulting in less noise in detection of the fluorescence or luminescence of a sample. The width or diameter of the voids 160A-C may approximately correspond to the size of the biological or chemical sample being analyzed. The voids 160A-C may be formed by the mask 152 and the metal layer or metal oxide layer 133B on the sides, and the passivation layer 120 on the bottom.

Figure 6:
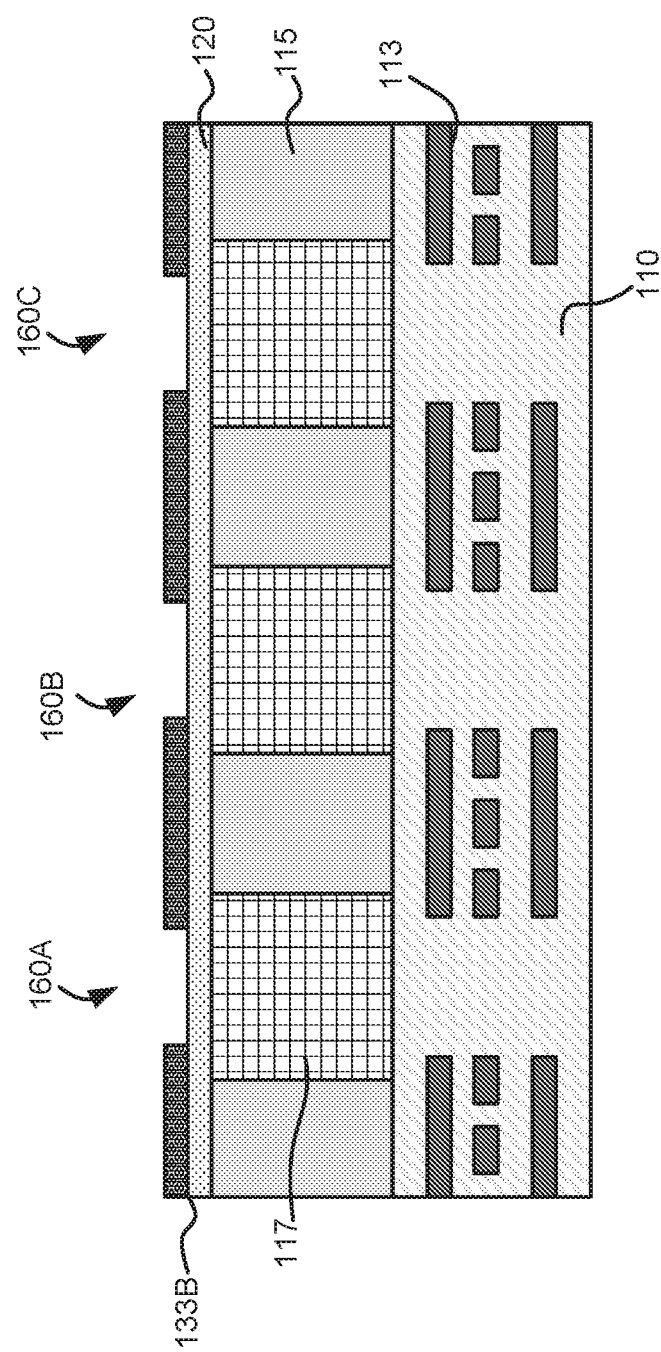
FIG. 6 is a cross-sectional view of a backside illumination CMOS image sensor with the mask removed, according to some embodiments.

According to FIG. 6, the mask 152 is removed from the metal layer or metal oxide layer 133B. Thus, voids 160A-C may be created by the metal layer or metal oxide layer 133B on the sides, and the passivation layer 120 on the bottom. The mask 152 may be removed by any suitable method, such as using a chemical solvent or etchant. In the case of a hard mask, the mask 152 may be physically or manually removed from the metal layer or metal oxide layer 133B. The voids 160A-C may form a spot or well into which biological or chemical samples may be placed, as described further herein. Although described herein with respect to a mask 152, it is contemplated that any method may be used to pattern the metal layer or metal oxide layer 133A. For example, other methods may include contact printing, dip pen lithography, and/or the like.

In some embodiments, a first covering layer 150 and a second covering layer 155, different from the first covering layer, may be selectively applied based on the differential surfaces of the metal layer or metal oxide layer 133B and the passivation layer 120, respectively. The first and second covering layers have different properties, resulting in an array of spots or wells comprising a bottom surface comprising the second covering layer, separated by areas (e.g., 133B) comprising the first covering layer. In some embodiments macromolecules of interest preferentially associate with the second covering layer compared with the first covering layer.

Figure 7:
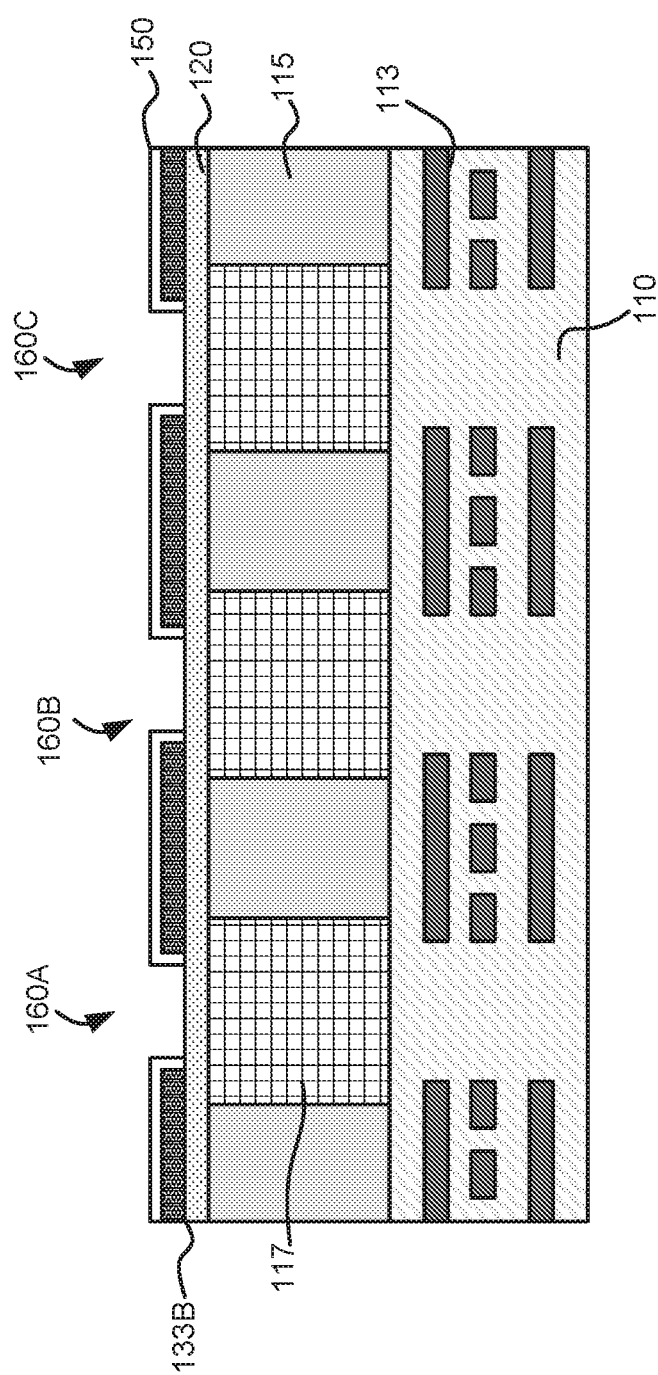
FIG. 7 is a cross-sectional view of a backside illumination CMOS image sensor with a first coating selectively applied due to differential surfaces, according to some embodiments.

As illustrated in FIG. 7, the first covering layer 150 may be selectively applied to the metal layer or metal oxide layer 133B based on its surface properties. For example, the first covering layer 150 may be of such a material that it may bond to and/or be attracted to the metal layer or metal oxide layer 133B. In some embodiments the first covering layer does not bind or adhere to, or is repelled by, the passivation layer 120, resulting in the structure shown in FIG. 7. The first covering layer 150 may be applied to the metal layer or metal oxide layer 133B according to any method or technique (e.g., chemical vapor deposition, dipping, spin coating, and/or the like). For example, the metal layer or metal oxide layer 133B may be coated or treated with a first material to form the first covering layer 150. The first covering layer 150 may be deposited according to conventional semiconductor processing techniques. It will be recognized that term "covering layer" is not intended to ascribe any particular structure or dimensions.

The first covering layer 150 may include any suitable material that adheres or binds the metal or metal oxide material 133B. In one approach the first covering layer 155 is produced by application of a phosphate compound that binds metal or metal oxide, including without limitation, inorganic phosphate, phosphonic acid, organic phosphate compounds such as hexamthethylphosphoramide, hexmamethyl tetraphospate, combinations thereof, and the like.

In some embodiments, the first covering layer 150 may include a material that repels biological or chemical analytes of interest. For example, the first covering layer 150 may include a material that has a negative charge, thus repelling negatively charged biological or chemical samples. In some embodiments, the first covering layer 150 may be hydrophobic. Those of ordinary skill in the art will recognize that combinations (e.g., pairwise combinations) of metals and the first covering layer can be selected and optimized for particular purposes.

Figure 8:
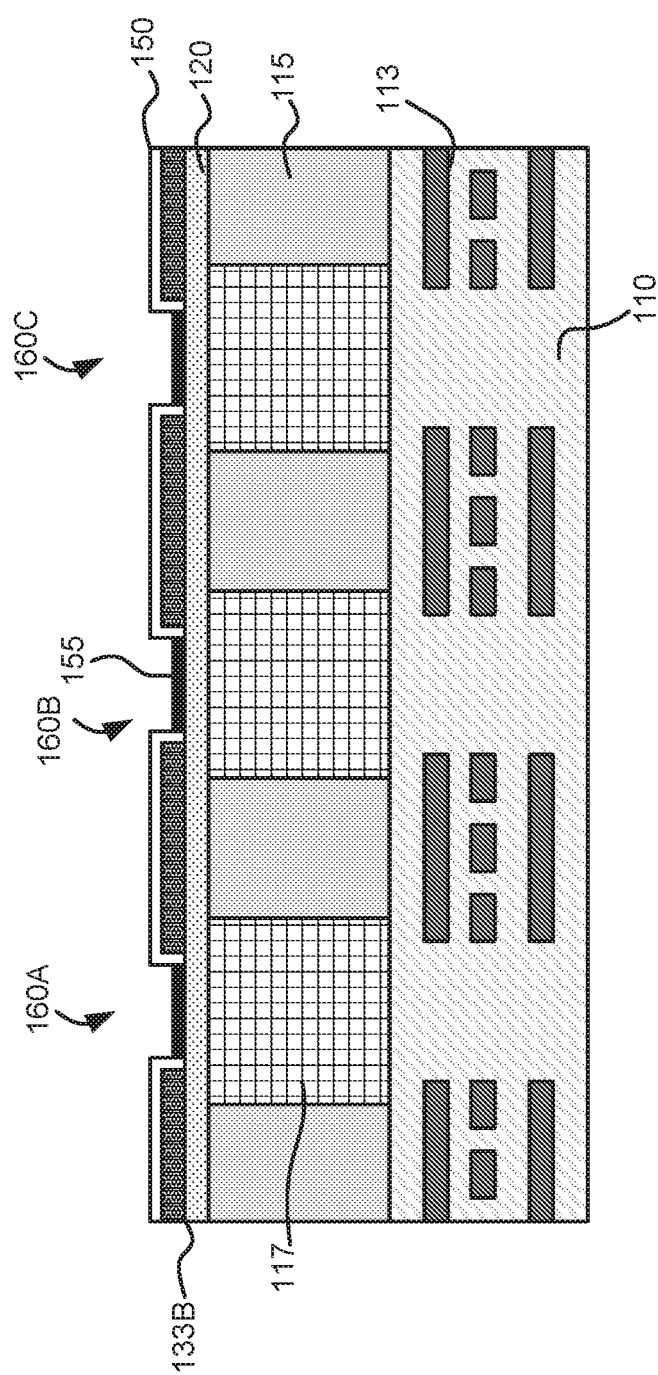
FIG. 8 is a cross-sectional view of a backside illumination CMOS image sensor with a second coating selectively applied due to differential surfaces, according to some embodiments.

As illustrated in FIG. 8, the second covering layer 155 may be selectively applied to the passivation layer 120 based on the surface properties of the passivation layer. For example, the second covering layer 155 may be of such a material that it may bond to and/or be attracted to the passivation layer 120, but does not bond to or adhere to the first covering layer 150 which covers metal or metal oxide 133B. The second covering layer 155 may be applied by coating or treating the exposed portions of the passivation layer 120 with a second material. In one approach, both the exposed passivation layer 120 and metal or metal oxide 133B regions covered by the first covering layer 150 are exposed to the second material, which adheres only on the passivation layer. The second covering layer 155 may be deposited according to conventional semiconductor processing techniques.

In one approach the second covering layer 155 is produced by application of silane or a silane compound, including without limitation, aminopropyltrimethoxysilane, 3-aminopropyl-methyldiethoxysilane, 3-aminopropyltriethoxysilane, etc. In some embodiments, the second covering layer 155 may include a material that attracts biological or chemical samples. For example, the second covering layer 155 may include a material that has a positive charge, thus attracting negatively charged biological or chemical samples. In some embodiments, the second covering layer 155 may be hydrophilic. Those of ordinary skill in the art will recognize that combinations (e.g., pairwise combinations) of the first covering layer and the passivation layer 120 (i.e., the surface of the passivation layer) can be selected and optimized for particular purposes.

It will be recognized that the term "covering layer" is not intended to limit the first and second covering layers to any particular method of application or structure. As noted, different properties of the first and the second covering layers may be selected to differentially retain target macromolecule(s), e.g., DNA macromolecules. It will also be recognized that the first and/or second covering layers may be functionalized such that the functionalized surface has a property that results in differential retention of target macromolecule(s). For illustration, after application of the first and second covering layers a DNA binding molecule (e.g., oligonucleotide) with affinity to the second covering layers, but not to the first covering layers, may be applied to cover second covering layer 155. In some embodiments, the second covering layer 155 is a functionalized surface on which a single nucleic acid molecule is amplified.

It will be recognized that the term "first covering layer" may refer to the material applied to the surface as well as the material retained on the surface (e.g., the latter may differ from the former by evaporation of a solvent; by a reaction with the surface material, and the like).

Thus, a structure may be created in which a first covering layer 150B is present on the metal layer or metal oxide 133B, and a second covering layer 155 is present in the voids 160A-C. The voids 160A-C may be formed by the first covering layer 150B and the metal layer or metal oxide layer 133B on the sides, and the passivation layer 120 on the bottom. The voids 160A-C may form a spot or well into which biological or chemical samples may be placed, as described further herein.

Figure 9:
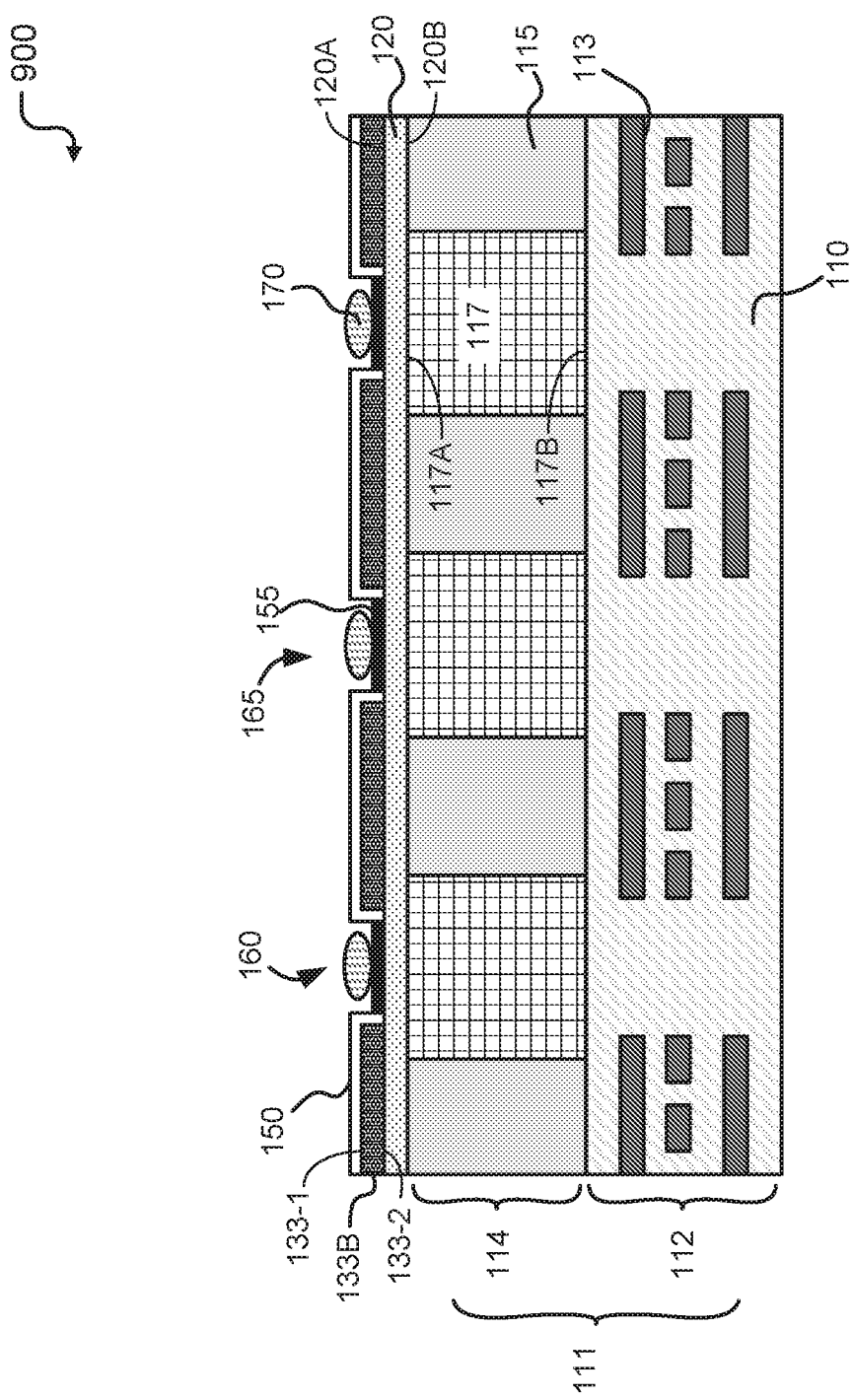
FIG. 9 is a cross-sectional view of a biosensor using a backside illumination CMOS image sensor with macromolecules, according to some embodiments.

According to FIG. 9, biological or chemical samples 170 may be introduced in the voids atop the second covering layer 155. The invention is not limited to any particular method of introduction. In some embodiments, the biological or chemical samples 170 may be attracted to or bind to the second covering layer 155, while being repelled by the first covering layer 150. This may prevent the biological or chemical samples 170 from sticking to the first covering layer 150B on the metal layer or metal oxide layer 133B where they cannot be sensed by the photodiodes 117.

As illustrated in FIGS. 6, 8 and 9, in some embodiments, the metal layer or metal oxide layer 133B and the top surfaces of photodiodes 117 or the passivation layer 120 form a plurality of wells or voids 160A-C, wherein wall(s) of each well are formed from the metal layer, and the bottoms of each well are formed from the photodiode 117 surface or from the overlying passivation layer 120. In some embodiments, the wall(s) may have a height, h, that extends from the well bottom to the level corresponding the top of covering layer 150B where the bottom and walls define the void(s) 160A-C. In some embodiments, the surface area of the well bottom is less that the surface area of the underlying photodiode. In some embodiments, the volume of the void 160A-C is in the range of $1\times10^{-24}$ m$^3$-$1\times10^{-21}$ m$^2$; and/or the height of the walls is in the range of 1 nm-500 nm; and/or the area of the bottom is in the range of $1\times10^{-15}$ m$^2$-$1\times10^{-14}$ m$^2$. In some embodiments, the ratio of the width or diameter of the well to the height of the walls is in the range of 1-200.

In some embodiments, as illustrated in FIG. 9, a biosensor 900 can include a backside illumination complementary metal-oxide-semiconductor (CMOS) image sensor 111. Backside illumination CMOS image sensor 111 can include an electronic circuit layer 112 and a photo sensing layer 114 over the electronic circuit layer. Electronic circuit layer 112 can be comprised of a dielectric layer 110 and metal wiring 113. Photo sensing layer 114 can include a substrate layer 115 and a plurality of photodiodes 117 having a first top surface 117A and a first bottom surface 117B. The first bottom surface 117B can be in contact with the electronic circuit layer 113 (connections not explicitly shown), and the first top surface 117A includes a light receiving surface. Biosensor 900 can also have a metal or metal oxide layer 133B over the photo sensing layer 114, and the metal or metal oxide layer 133B has a second top surface 133-1 and a second bottom surface 133-2. The metal or metal oxide layer 133B defines a plurality of voids 160, and each void of the plurality of voids 160 can be aligned with at least one photodiode of the plurality of photodiodes 117. The second top surface 133-1 can be coated or treated with a first material 150 to form a first covering layer. Biosensor 900 can also have a passivation layer 120 over the plurality of photodiodes 117, and the passivation layer has a third top surface 120A and a third bottom surface 120B. The metal or metal oxide layer 133B and the third top surface 120A of the passivation layer 120 form a plurality of wells 165. The walls of each well are formed from the metal or metal oxide layer 133B, and the bottom of each well is formed from the third top surface 120A of the passivation layer 120. The bottom of each well can be coated or treated with a second material 155 to form a second covering layer. The first material 150 is different that second material 155.

In some embodiments of biosensor 900, the first material can include at least one of phosphate or phosphonic acid. The second material can include silane. In some embodiments, the plurality of wells are functionalized to receive macromolecules. In some embodiments, the macromolecules are less likely to bind to the first material than to the second material. In some embodiments, the second material is configured to bind the macromolecules, and the first material is configured not to bind to the macromolecules. In some embodiments, the second material can include a ligand that binds the macromolecules. Without limitation, the macromolecule can be a nucleic acid, protein (e.g., antigen), or antibody, and the ligand can be an oligonucleotide, DNA binding protein, antigen, or antibody. The macromolecules can be antibodies that bind a DNA macromolecule. In some embodiments, the first material is hydrophobic, and the second material is hydrophilic. At least one well can be occupied by a macromolecule analyte. The macromolecule analyte can be a nucleic acid or antibody.

The biological or chemical samples may include any of a number of components. For example, a sample may contain nucleic acid macromolecules (e.g., DNA, RNA, etc.), proteins, and the like. The sample may be analyzed to determine a gene sequence, DNA-DNA hybridization, single nucleotide polymorphisms, protein interactions, peptide interactions, antigen-antibody interactions, glucose monitoring, cholesterol monitoring, and the like.

As discussed above, in some embodiments the biomolecule is a nucleic acid, such as DNA. Without limitation, the DNA biomolecule may be a DNA nanoball (single stranded concatemer) hybridized to labeled probes (e.g., in DNB sequencing by ligation or cPAL methods) or to complementary growing strands (e.g., in DNB sequencing by synthesis methods) or both; or to a single DNA molecule (e.g., in single molecule sequencing); or to a clonal population of DNA molecules, such as is created in bridge PCR based sequencing. Thus, reference to "a biomolecule", "a DNA macromolecule" or "a nucleic acid macromolecule" may encompass more than one molecule (e.g., a DNB associated with multiple growing complementary strands or a DNA cluster comprising clonal population of hundreds or thousands of DNA molecules). See, e.g., U.S. Pat. No. 8,133,719; U.S. Pat. App. Pub. No. 2013/0116153, U.S. Pat. App. Pub. No. 2016/0237488; U.S. Pat. App. Pub. No. 2012/0224050; U.S. Pat. Nos. 8,133,719; 7,910,354; 9,222,132; 6,210,891; 6,828,100, 6,833,246; and 6,911,345, herein incorporated by reference in their entireties.

In some embodiments, the nucleic acid macromolecules may be amplicons of genomic DNA fragments or a cDNA library. As used herein, an "amplicon" may be the product of amplification of a nucleic acid molecule, typically a fragment of genomic DNA or a cDNA library. Methods of amplification include, but are not limited to, rolling circle amplification, as described, for example, in U.S. Pat. No. 8,445,194 (herein incorporated by reference in its entirety), or bridge polymerase chain reaction (PCR), as described, for example, in U.S. Pat. No. 7,972,820, herein incorporated by reference in its entirety. The amplification may be performed before the nucleic acid is contacted with the biosensor, or in situ, as described, for example, in U.S. Pat. No. 7,910,354, herein incorporated by reference in its entirety.

For example, a biological sample, such as a DNA macromolecule, oligonucleotide, or nucleotide, associated with a fluorescent or chemiluminescent dye, may be placed above a photodiode 117. In the case of fluorescence, the dye may be illuminated by excitation light from an excitation light source. The excitation light may correspond to any suitable type or intensity of light, including, for example, visible light, infrared (IR), ultraviolet (UV), and the like. The excitation light may also come from any suitable source, such as light emitting diodes (LEDs), lamps, lasers, combinations thereof, and the like. When the dye is illuminated with excitation light at a certain wavelength, the biological sample may absorb the light, then emit light of a different wavelength. For example, the biological sample may absorb excitation light having a 450 nm wavelength, but emit light with a 550 nm wavelength. In other words, fluorescent light of a characteristic wavelength may be emitted when the dye is illuminated by light of a characteristic different wavelength (i.e., the excitation light source). Because excitation light is used to measure fluorescence, however, it must be filtered out in order to take accurate measurements at the photodiode 117.

In the case of chemiluminescence, no excitation light source is needed for the photodiode 117 to detect emitted light. Instead, the biological sample may emit light due to a chemical or enzymatic reaction that may occur between the biological sample and the chemiluminescent dye (or other solution), causing light to be emitted due to breaking or forming, chemical bonds.

For both fluorescence and chemiluminescence, the photodiode 117 may detect the intensity of the emitted light and transform it into an electronic signal based on the intensity of the light that may be provided to an external device via metal wiring 113. The external device may correlate the electronic signal to a particular wavelength and brightness, based on the electronic signal.

In some embodiments, the active spot or well on the surface of the biosensor and the nucleic acid macromolecule may be mutually configured such that each spot binds only one nucleic acid macromolecule. This may be achieved, for example, by contacting the surface with amplicons that correspond in size to the active spot (e.g., an amplicon having a diameter that is effectively as large or larger than the diameter of the active spot). See U.S. Pat. No. 8,445,194, herein incorporated by reference in its entirety. Alternatively, the active spot can be chemically adapted to bind a single DNA fragment, which may then be amplified to fill a larger region at and around the original binding site.

Some embodiments of the invention may be used to determine different labels corresponding to different wavelengths of light. The labels may be, for example, fluorescent, chemiluminescent or bioluminescent labels. For example, in gene sequencing (or DNA sequencing), embodiments of the invention may be used to determine the precise order of nucleotide bases within a nucleic acid macromolecule (e.g., a strand of DNA). The nucleotide bases may be labeled with a specific fluorescent label (e.g., adenine (A), guanine (G), cytosine (C), or thymine (T)). Alternatively, one color, two color, or three color sequencing methods, for example, may be used.

With respect to fluorescence, each of the nucleotide bases may be determined in order by successively exciting the nucleic acid macromolecule with excitation light. The nucleic acid macromolecule may absorb the excitation light and transmit an emitted light of a different wavelength onto a biosensor as described herein. The biosensor may measure the wavelength of emitted light and intensity received by the photodiode. Each nucleotide (e.g., fluorescently labeled nucleotide), when excited by excitation light of a certain wavelength and/or intensity, may emit a certain wavelength of light and/or intensity into the photodiode, allowing identification of the presence of a particular nucleotide base at a particular position in the nucleic acid macromolecule. Once that particular nucleotide base has been determined, it may be removed from the nucleic acid macromolecule, such that the next successive nucleotide base may be determined according to a similar process.

A nucleic acid macromolecule may be labeled with one or more different fluorescent, chemiluminescent, or bioluminescent labels before or after attaching to the biosensor for any purpose. For example, the nucleic acid macromolecule may be hybridized with a labeled oligonucleotide probe or amplification primer. Alternatively, the nucleic acid macromolecule may be hybridized with a non-labeled oligonucleotide, which may then be ligated to a labeled probe, or extended using labeled nucleotide analogs. By way of illustration, the labeling may be done for the purpose of characterizing the nucleic acid macromolecule (for example, the presence of a single nucleotide polymorphism (SNP) associated with a disease), or for nucleic acid sequencing of all or a part of the nucleic acid macromolecule, as described above. DNA sequencing by probe hybridization is described, for example, in U.S. Pat. No. 8,105,771, herein incorporated by reference in its entirety. Sequencing by anchor probe ligation is described, for example, in U.S. Pat. No. 8,592,150, herein incorporated by reference in its entirety. Sequencing by synthesis is described, for example, in U.S. Pat. No. 7,883,869, herein incorporated by reference in its entirety.

In some embodiments, the biosensor may be reversibly coupled to a flow cell (not shown). The nucleic acid macromolecule may be attached to the biosensor by contacting the biosensor with a liquid sample in the flow cell. The flow cell may include one or more flow channels that are in fluid communication with the reaction sites (e.g., voids). In one example, the biosensor may be fluidically and electrically coupled to a bioassay system. The bioassay system may deliver reagents to the reaction sites according to a predetermined protocol and perform imaging events. For example, the bioassay system may direct solutions to flow along the reaction sites. The solution may include four types of nucleotides having the same or different fluorescent labels. In some embodiments, the bioassay system may then illuminate the reaction sites using an excitation light source. The excitation light may have a predetermined wavelength or wavelengths. The excited fluorescent labels may provide emission signals that may be detected by the photodiodes 117.

A user may prepare for sequencing by contacting a biosensor according to described embodiments with nucleic acid amplicons, or with a nucleic acid that is subsequently amplified, such that the nucleic acid macromolecule binds and is retained by the active spots or wells, and excess nucleic acid macromolecule may be washed away. The nucleic acid macromolecules may be contacted beforehand or in situ with a labeled reagent. The biosensor may then be operated as described herein to determine light emitted on or around nucleic acid macromolecules on the array. The light may be quantified, or it may be sufficient to determine in a binary fashion which of the nucleic acid macromolecules on the surface have been labeled with labels that emit at a particular wavelength. Different probes or different nucleic acid analogs may be used concurrently that have labels that emit light at different wavelengths, for example, to determine different bases at a particular position in the sequence, or to sequence multiple locations.

Although described herein with respect to a backside illumination CMOS sensor, it is contemplated that embodiments of the invention may be similarly applied to a frontside illumination CMOS sensor. Further, it is contemplated that embodiments of the invention may similarly apply to any suitable biosensor, such as those biosensors described in U.S. Provisional Pat. App. No. 62/416,813, filed Nov. 3, 2016, which is herein incorporated by reference in its entirety.

Although the processes described herein are described with respect to a certain number of steps being performed in a certain order, it is contemplated that additional steps may be included that are not explicitly shown and/or described. Further, it is contemplated that fewer steps than those shown and described may be included without departing from the scope of the described embodiments (i.e., one or some of the described steps may be optional). In addition, it is contemplated that the steps described herein may be performed in a different order than that described.

In the foregoing description, aspects of the application are described with reference to specific embodiments thereof, but those skilled in the art will recognize that the invention is not limited thereto. Thus, while illustrative embodiments of the application have been described in detail herein, it is to be understood that the inventive concepts may be otherwise variously embodied and employed, and that the appended claims are intended to be construed to include such variations, except as limited by the prior art. Various features and aspects of the above-described invention may be used individually or jointly. Further, embodiments can be utilized in any number of environments and applications beyond those described herein without departing from the broader spirit and scope of the specification. The specification and drawings are, accordingly, to be regarded as illustrative rather than restrictive. For the purposes of illustration, methods were described in a particular order. It should be appreciated that in alternate embodiments, the methods may be performed in a different order than that described.

Other variations are within the spirit of the present disclosure. Thus, while the disclosed techniques are susceptible to various modifications and alternative constructions, certain illustrated embodiments thereof are shown in the drawings and have been described above in detail. It should be understood, however, that there is no intention to limit the disclosure to the specific form or forms disclosed, but on the contrary, the intention is to cover all modifications, alternative constructions and equivalents falling within the spirit and scope of the disclosure, as defined in the appended claims.

What is claimed is:

1. A biosensor comprising:
a backside illumination complementary metal-oxide-semiconductor (CMOS) image sensor including:
an electronic circuit layer; and
a photo sensing layer over the electronic circuit layer, wherein the photo sensing layer includes:
a substrate layer, and
a plurality of photodiodes having a first top surface and a first bottom surface,
wherein the first bottom surface is in contact with the electronic circuit layer, and
wherein the first top surface includes a light receiving surface;
a metal or metal oxide layer over the photo sensing layer, wherein the metal or metal oxide layer has a second top surface and a second bottom surface, wherein the metal or metal oxide layer defines a plurality of voids, wherein each void of the plurality of voids is aligned with at least one photodiode of the plurality of photodiodes, and wherein the second top surface is coated or treated with a first material to form a first covering layer;

a passivation layer over the plurality of photodiodes, the passivation layer having a third top surface and a third bottom surface, wherein the metal or metal oxide layer and the first top surface of the plurality of photodiodes or the third top surface of the passivation layer form a plurality of wells, wherein wall(s) of each well are formed from the metal or metal oxide layer, and wherein a bottom of each well is formed from the third top surface of the passivation layer, wherein the bottom of each well is coated or treated with a second material to form a second covering layer, and wherein the first material is different than the second material.

2. The biosensor of claim 1, wherein the first material includes at least one of phosphate or phosphonic acid.

3. The biosensor of claim 1, wherein the second material includes silane.

4. The biosensor of claim 1, wherein the plurality of wells are functionalized to receive macromolecules.

5. The biosensor of claim 4, wherein the second material is configured to bind the macromolecules, and wherein the first material is configured not to bind to the macromolecules.

6. The biosensor of claim 5, wherein the second material comprises a ligand that binds the macromolecules.

7. The biosensor of claim 6, wherein the macromolecules are a nucleic acid or antibody and the ligand is an oligonucleotide or antibody.

8. The biosensor of claim 6, wherein the macromolecules are antibodies that bind a macromolecule.

9. The biosensor of claim 1, wherein the first material is hydrophobic.

10. The biosensor of claim 1, wherein the second material is hydrophilic.

11. A method comprising:
providing a backside illumination complementary metal-oxide-semiconductor (CMOS) image sensor, wherein providing the backside illumination CMOS image sensor includes:
providing an electronic circuit layer; and
providing a photo sensing layer over the electronic circuit layer, wherein the photo sensing layer includes:
a substrate layer; and
a plurality of photodiodes having a first top surface and a first bottom surface, wherein the first bottom surface is in contact with the electronic circuit layer, and wherein the first top surface includes a light receiving surface;

forming a metal or metal oxide layer over the photo sensing layer, wherein the metal or metal oxide layer has a second top surface and a second bottom surface, wherein the metal or metal oxide layer defines a plurality of voids, wherein each void of the plurality of voids is aligned with at least one photodiode of the plurality of photodiodes, and wherein the second top surface is coated or treated with a first material to form a first covering layer; and forming a passivation layer over the plurality of photodiodes, the passivation layer having a third top surface and a third bottom surface, wherein the metal or metal oxide layer and the first top surface of the plurality of photodiodes or the third top surface of the passivation layer form a plurality of wells, wherein wall(s) of each well are formed from the metal layer, and wherein a bottom of each well is formed from the third top surface of the passivation layer, wherein the bottom of each well is coated or treated with a second material to form a second covering layer, and wherein the first material is different than the second material.

12. The method of claim 11, wherein the first material includes at least one of phosphate or phosphonic acid.

13. The method of claim 11, wherein the second material includes silane.

14. The method of claim 11, wherein the plurality of wells are functionalized to receive macromolecules.

15. The method of claim 14, wherein the second material binds to the macromolecules, and wherein the first material does not bind to the macromolecules.

16. The method of claim 15, wherein the second material comprises a ligand that binds the macromolecules.

17. The method of claim 16, wherein the macromolecules are a nucleic acid or antibody and the ligand is an oligonucleotide or antibody.

18. The method of claim 16, wherein the macromolecules are antibodies that bind a macromolecule.

19. The method of claim 11, wherein the first material is hydrophobic.

20. The method of claim 11, wherein the second material is hydrophilic.

* * * * *